(12) United States Patent
Cafe et al.

(10) Patent No.: US 10,340,981 B2
(45) Date of Patent: Jul. 2, 2019

(54) DATA CENTER MANAGEMENT USING DEVICE IDENTIFICATION OVER POWER-LINE

(71) Applicant: Cisco Technology, Inc., San Jose, CA (US)

(72) Inventors: Daniel James Cafe, Strathfield (AU); Ben Kelly, Inglewood (AU); Alpesh S. Patel, Cary, NC (US)

(73) Assignee: Cisco Technology, Inc., San Jose, CA (US)

( * ) Notice: Subject to any disclaimer, the term of this patent is extended or adjusted under 35 U.S.C. 154(b) by 11 days.

(21) Appl. No.: 15/480,763

(22) Filed: Apr. 6, 2017

(65) Prior Publication Data

US 2017/0214432 A1 Jul. 27, 2017

Related U.S. Application Data

(63) Continuation of application No. 14/919,873, filed on Oct. 22, 2015, now Pat. No. 9,647,723.

(51) Int. Cl.
*H04B 3/54* (2006.01)
*H05K 7/14* (2006.01)
*G06F 1/26* (2006.01)
*G05B 23/02* (2006.01)

(52) U.S. Cl.
CPC ........... *H04B 3/544* (2013.01); *H05K 7/1498* (2013.01); *G05B 23/02* (2013.01); *G06F 1/26* (2013.01); *G06F 1/266* (2013.01); *H05K 7/1492* (2013.01)

(58) Field of Classification Search
CPC ........... G06F 1/26; G05B 23/02; H04B 3/544; H05K 7/1492; H05K 7/1498; H02J 13/0082; Y02B 90/2615; Y04S 40/121
USPC ........................................................ 375/257
See application file for complete search history.

(56) References Cited

U.S. PATENT DOCUMENTS

| 2003/0169156 A1 | 9/2003 | Perret | |
|---|---|---|---|
| 2008/0263150 A1 | 10/2008 | Childers et al. | |
| 2009/0287949 A1* | 11/2009 | Bradicich | G06F 1/3203 713/340 |
| 2014/0177738 A1* | 6/2014 | Alshinnawi | H04B 3/54 375/257 |
| 2014/0181564 A1* | 6/2014 | Alshinnawi | G06F 1/189 713/340 |

(Continued)

*Primary Examiner* — Leila Malek
(74) *Attorney, Agent, or Firm* — Behmke Innovation Group LLC; James Behmke; Stephen D. LeBarron

(57) ABSTRACT

In one embodiment, a first device (e.g., a host device or power distribution unit) stores identification information of the first device, and determines, over a power connection, when the first device is in powered connectivity with a second device (e.g., a power distribution unit or host device, respectively). The first device may then communicate, with the second device over the power connection, identification information of at least one of either the first or second device, where the communicated identification information is accessible to a third device (e.g., a server) via a data network due to the communicating over the power connection. In another embodiment, a server may determine, based on the identification information, a physical location of a power distribution unit, and may deduce, based on the physical location of the power distribution unit, that a host device is physically located at the physical location of the power distribution unit.

14 Claims, 19 Drawing Sheets

(56) References Cited

U.S. PATENT DOCUMENTS

2015/0280491 A1\* 10/2015 Lin .................. G06F 1/263
  307/26

\* cited by examiner

DATA CENTER MANAGEMENT USING DEVICE IDENTIFICATION OVER POWER-LINE

RELATED APPLICATION

The present application is a Continuation application of U.S. patent application Ser. No. 14/919,873, filed Oct. 22, 2015, entitled DATA CENTER MANAGEMENT USING DEVICE IDENTIFICATION OVER POWER-LINE, by Daniel James Cafe et al., the contents of which is hereby incorporated by reference

TECHNICAL FIELD

The present disclosure relates generally to computer networks, and, more particularly, to data center management using device identification over power-line.

BACKGROUND

Keeping track of physical devices and their location can often be a tedious and time-consuming task. This is particularly the case for equipment within a data center. Keeping track can often be a complex process involving a large amount of hours spent auditing, bar-coding, and documenting devices as they are commissioned, migrated within a facility, or decommissioned from a facility. As these are often performed as a manual process completed by workers, there is opportunity for errors in collection of this data, as well as opportunity for data to become out-of-date. In addition, knowledge of and/or control over the power state of devices in a data center has long been a difficult problem, with many attempts to address such power state management leading to either overly complex systems or otherwise inefficient systems.

BRIEF DESCRIPTION OF THE DRAWINGS

The embodiments herein may be better understood by referring to the following description in conjunction with the accompanying drawings in which like reference numerals indicate identically or functionally similar elements, of which.

DESCRIPTION OF EXAMPLE EMBODIMENTS

Overview

According to one or more embodiments of the disclosure, a first device (e.g., a host device or a power distribution unit) stores identification information of the first device, and determines, over a power connection, when the first device is in powered connectivity with a second device (e.g., a power distribution unit or a host device, respectively). The first device may then communicate, with the second device over the power connection in response to the powered connectivity, identification information of at least one of either the first device or the second device, where the communicated identification information is accessible to a third device (e.g., a server) via a data network due to the communicating over the power connection.

According to one or more additional embodiments of the disclosure, a server receives identification information of a host device and a power distribution unit over a data network, where the host device and power distribution unit initially communicated the identification information over a power connection that provides powered connectivity from the power distribution unit to the host device. The server may then determine, based on the identification information, a physical location of the power distribution unit, and may deduce, based on the physical location of the power distribution unit, that the host device is physically located at the physical location of the power distribution unit.

Description

As will be understood by those skilled in the art, a data center is a facility that stores computer systems and associated components (e.g., computational, telecommunications, and storage systems). Often, data centers use redundant or backup power supplies, in addition to redundant data communications connections and other systems.

Figure 1A:
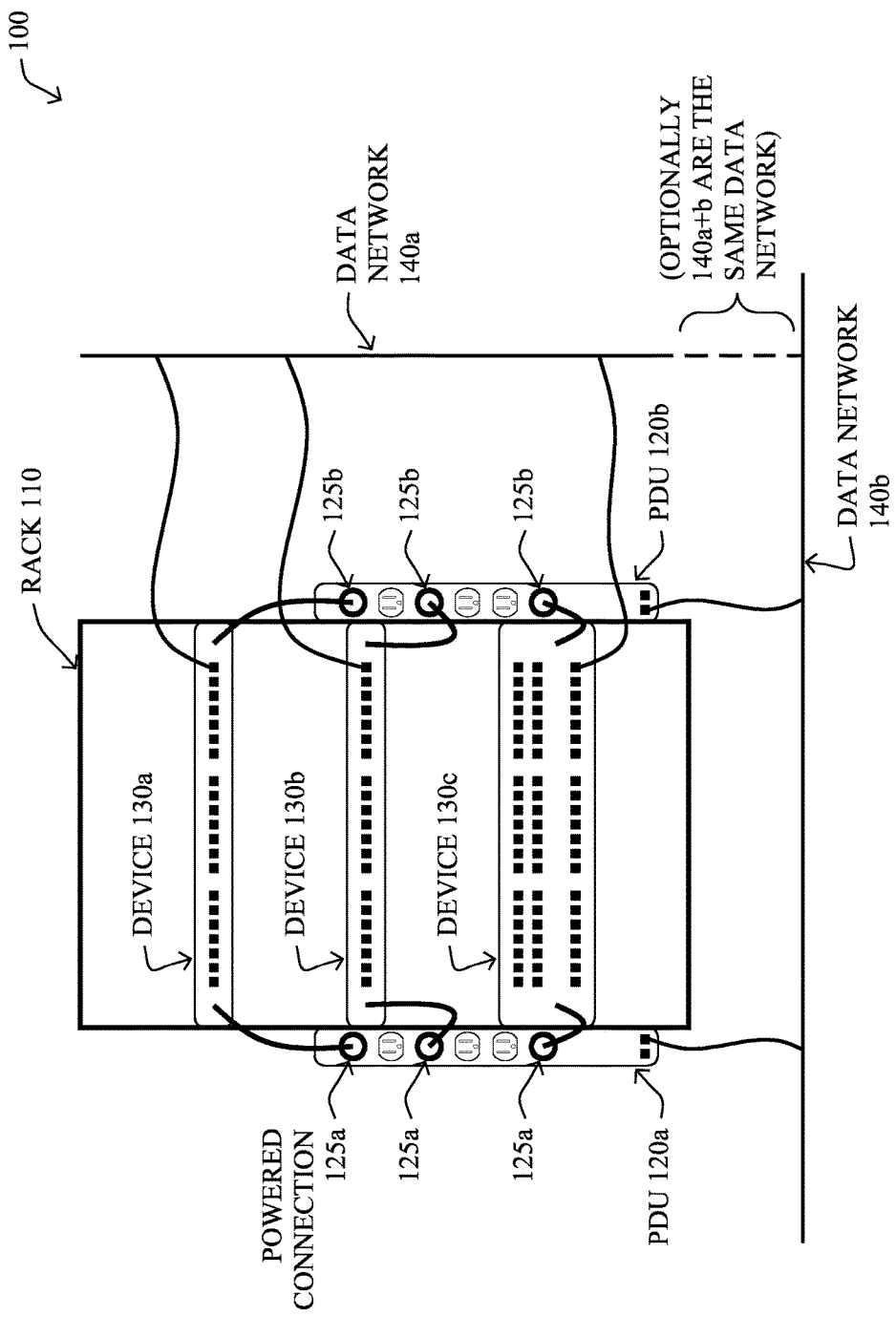
FIG. 1A illustrates an example networked device and power arrangement (e.g., a rack)
Figure 1B:
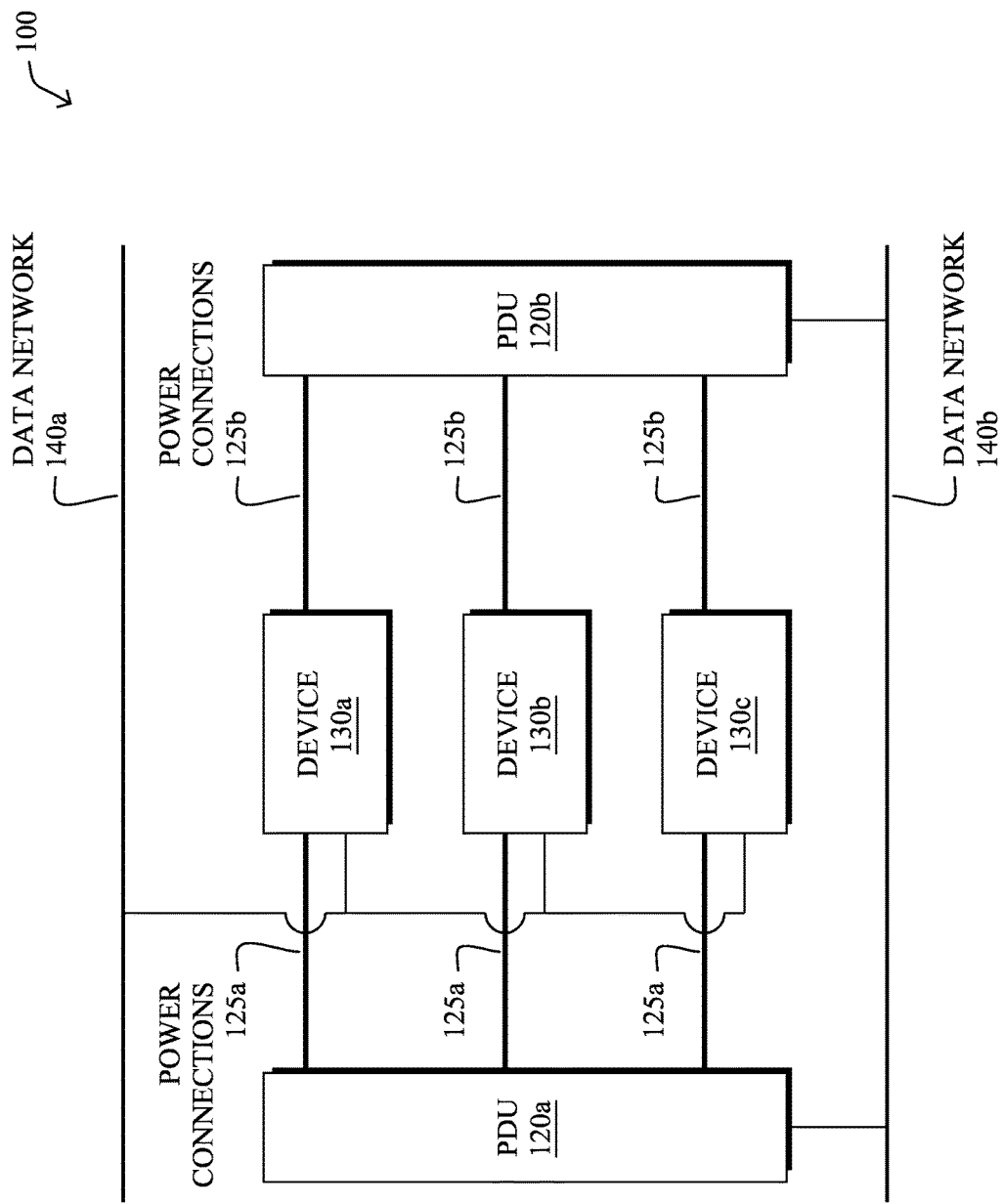
FIG. 1B illustrates another example networked device and power arrangement.

FIG. 1A illustrates an example simplified networked device and power arrangement, such as a portion of a data center 100, where a supporting rack 110 may be associated with one or more power distribution units (PDUs) 120 (e.g., 120a and 120b), which are configured to supply power over powered connections 125 (e.g., 125a and 125b, respectively) to connected host devices 130 (e.g., 130a, 130b, and 130c), such as routers, switches, servers, security devices, etc. In addition, the devices 130 may be connected to a data network 140a (e.g., an Ethernet network), while PDUs 120 may also be connected to a data network 140b, which in certain embodiments, may be the same data network as 140a. FIG. 1B illustrates another example simplified networked device and power arrangement, illustrating the core components of FIG. 1A in a simplified block diagram view.

As noted above, keeping track of physical devices and their location can often be a tedious and time-consuming task. This is particularly the case for equipment within a data center. Keeping track can often be a complex process involving a large amount of hours spent auditing, barcoding, and documenting devices as they are commissioned, migrated within a facility, or decommissioned from a facility. As these are often performed as a manual process completed by workers, there is opportunity for errors in collection of this data, as well as opportunity for data to become out-of-date. In addition, knowledge of and/or control over the power state of devices in a data center has long been a difficult problem, with many attempts to address such power state management leading to either overly complex systems or otherwise inefficient systems.

In addition to the above listed problems of device tracking, occasionally it is necessary to conduct work on a data center's power supply. Usually this is conducted on the A-side or B-side separately. That is, as most host devices 130 have dual power supplies, if one goes down the machine will keep operation. However, if a power supply has failed, or a chassis has only one power supply, the owner would generally appreciate being notified that they will be impacted by the outage. Identification of these hosts is currently conducted manually. Also, where a host has been incorrectly wired such that both power supplies have been connected to the same power side, the owner should be identified such that the wiring can be remediated.

The techniques herein present a way for host devices to automatically identify themselves and be added to data center inventories via the use of an internal host identifier communicated with a smart PDU via power-line communication. In general, PDUs 120 (or "cabinet PDU" (CDU), or other types of smart power units), are often deployed in a known physical location. That is, PDUs will often be configured as part of a data center deployment, and are left static during the operational phase of a data center. Devices 130 will generally be connected to PDUs in the rack 110 in which they reside, associating the device 130 to a physical location (i.e., of the PDU 120). This will allow rapid inventory updating via an automated process as described herein. For instance, as described below, various administrative features become available through the techniques herein, particularly opposed to manually taking inventory, such as querying a smart PDU to identify hardware within a rack or determining rack space utilization rapidly and accurately, as well as querying A-side and B-side smart PDUs in a rack to allow rapid highlighting of devices with single or failed power supplies during data center power maintenance.

Specifically, according to one or more embodiments of the disclosure as described in detail below, a first device (e.g., a host device 130 or a PDU 120) stores its identification information, and determines, over a power connection 125, when it is in powered connectivity with a second device (e.g., a PDU or a host device, respectively). The first device may then communicate, with the second device over the power connection in response to the powered connectivity, identification information of at least one of either the first device or the second device, where the communicated identification information is accessible to a third device (e.g., a server) via a data network 140 due to the communicating over the power connection.

According to one or more additional embodiments of the disclosure, a server receives identification information of a host device 130 and a PDU 120 over a data network 140, where the host device and power distribution unit initially communicated the identification information over a power connection that provides powered connectivity from the power distribution unit to the host device (mentioned above). The server may then determine, based on the identification information, a physical location of the PDU, and may deduce, based on the physical location of the PDU, that the host device is physically located at the physical location of the power distribution unit.

Figure 2:
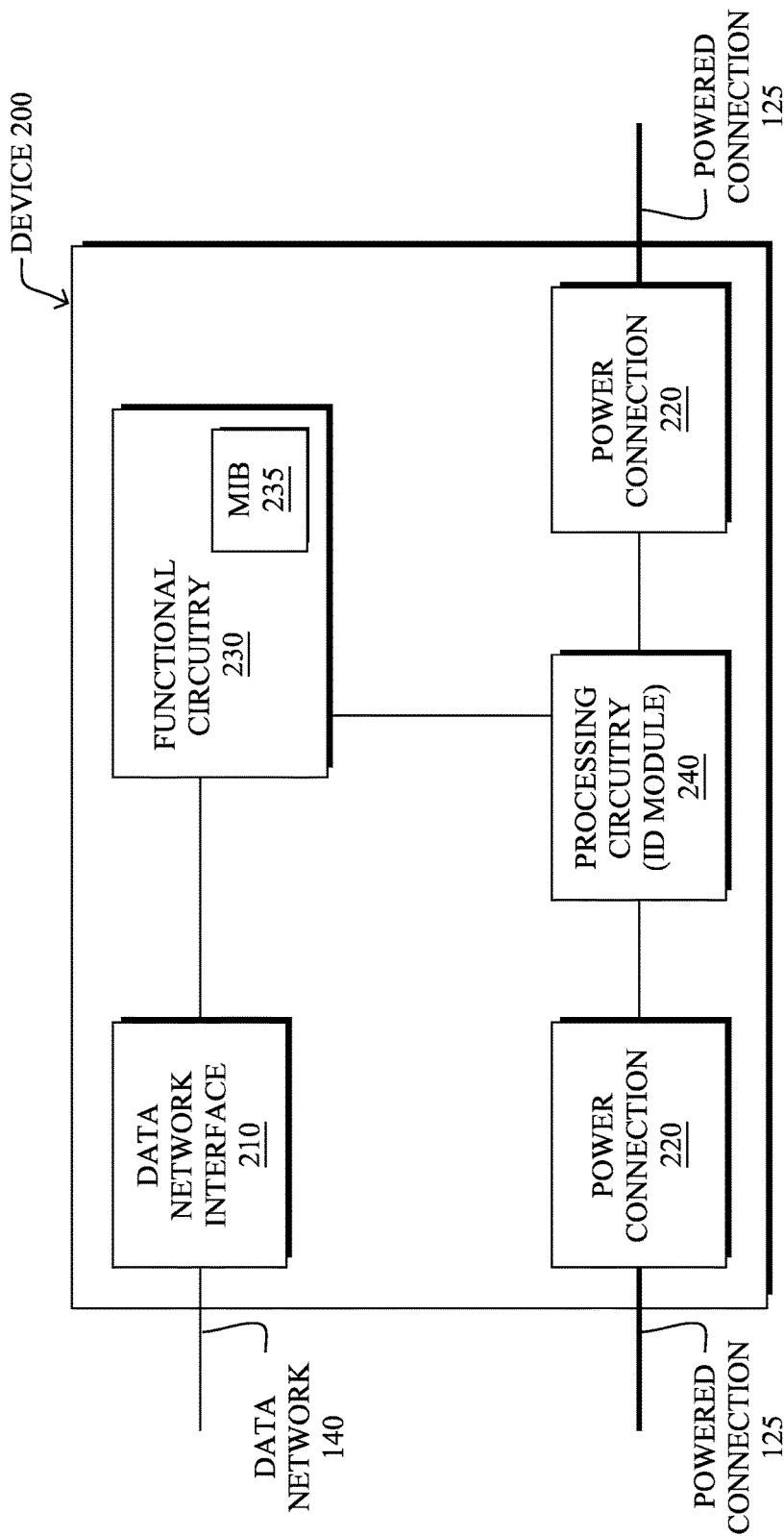
FIG. 2 illustrates an example device.

FIG. 2 is a schematic block diagram of an example simplified device 200 that may be used with one or more embodiments described herein, e.g., as any of the devices shown in FIG. 1 above (e.g., host device 130 or PDU 120). The device 200 may comprise one or more data network interfaces 210 (e.g., Ethernet or other protocols, notably whether wired or wireless), at least one power connection/supply 220, and whatever functional circuitry 230 (e.g., a processor, memory, operating systems, software programs, data structures, etc.) the device 200 requires for its configured functionality. As described below, one such data structure may be a management information base (MIB) 235.

The network interface(s) 210 contain the mechanical, electrical, and signaling circuitry for communicating data over links coupled to the data network 140. The network interfaces may be configured to transmit and/or receive data using a variety of different communication protocols. Also, in accordance with the techniques herein, a power connection/supply 220 is configured to allow for communicating through the powered connection 125, such as for power-line communication (PLC).

The processing circuitry ("ID module") 240 may contain data structures and/or computer executable instructions executed by a processor to perform functions as described herein. Illustratively, the techniques described herein may be performed by the processing circuitry 240 as hardware, software, and/or firmware, and may be performed in conjunction with functional circuitry 230. It will be apparent to those skilled in the art that other processor and memory types, including various computer-readable media, may be used to store and execute program instructions pertaining to the techniques described herein. Also, while the description illustrates various processes or circuitry, it is expressly contemplated that various processes may be embodied as modules configured to operate in accordance with the techniques herein (e.g., according to the functionality of a similar process). Further, while the processes/circuitry may have been shown separately, those skilled in the art will appreciate that processes may be routines or modules within other processes.

In general, the techniques herein are based on communication between a host device 130 (e.g., server, switch, storage device, computer, etc.) and a PDU 120. Host devices 130, in particular, may comprise processing circuitry 240 that is located within the device (e.g., within the chassis), and that stores identification (ID) information for the host device. That is, information about the device may be "built" into a frame (e.g., configured statically (e.g., flashed) into the processing circuitry 240), and as described below, modulated and broadcast across the power-line (e.g., at regular intervals) via the power supply or supplies in the device. Such information may comprise, for example, one or more of the following pieces of information about the host (e.g., and stored in a database of the processing circuitry):

Configured name;
Configured management IP address;
Manufacturer;
Device type/model;
Device serial number;
Number of rack units the device takes up;
Maximum possible power draw of the device;

Current power draw (a dynamic/adjusted value);
Etc.

According to one or more embodiments herein, a smart PDU 120 may be similarly configured, where the PDU's processing circuitry (ID module) 240 (e.g., a database of the processing circuitry) may be configured with (but not limited to):

Configured name;
Configured management IP address;
Manufacturer;
Device type/model;
Device serial number;
Rack/physical location;
Etc.

This PDU information may also be built into a frame, modulated and broadcast across the power-line to the host device in various configurations, as described below.

Figure 3:
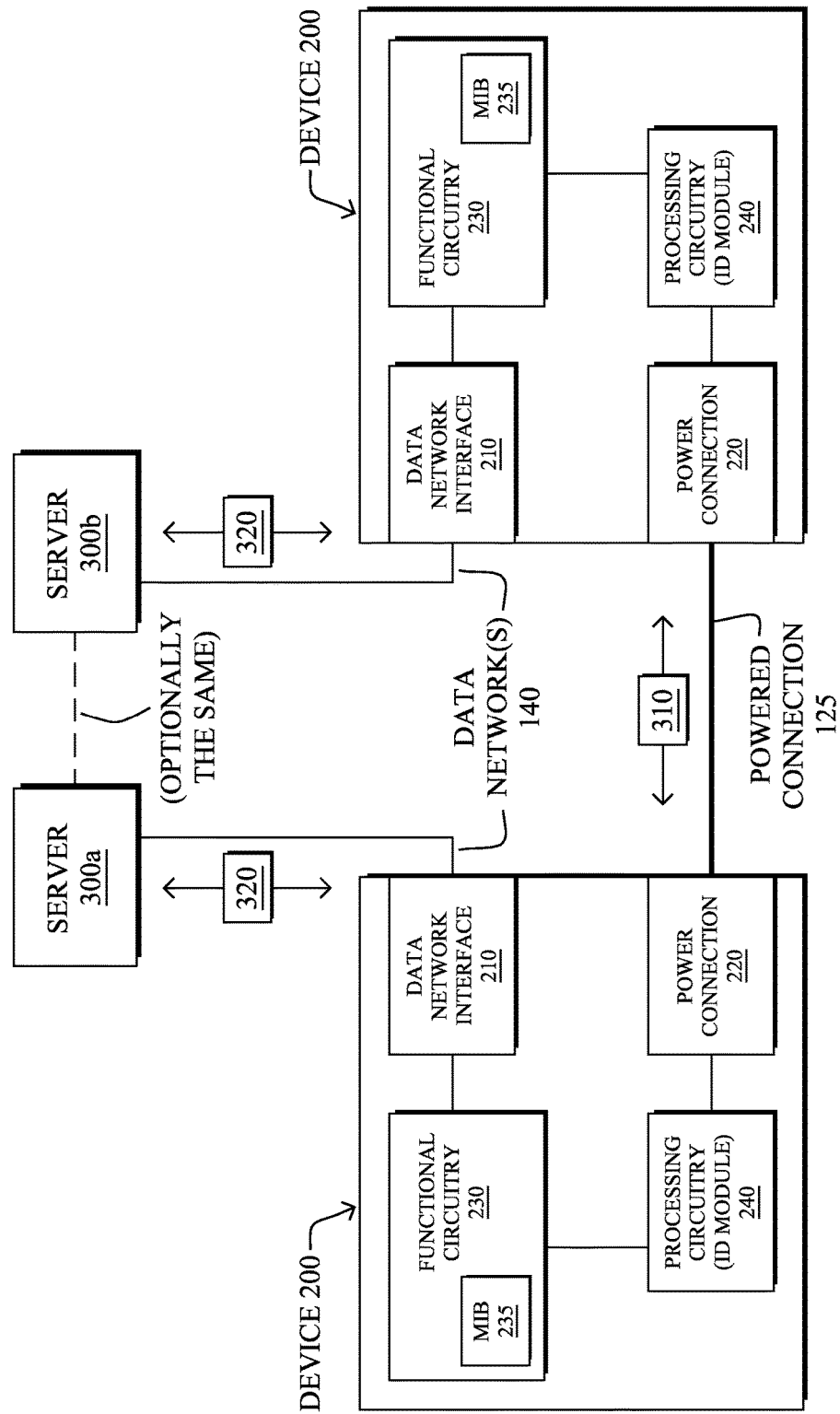
FIG. 3 illustrates an example of device identification over power-line for data center management.

Illustratively, FIG. 3 is an example of device identification over power-line for data center management, where two generic devices 200 are shown (e.g., one as a host device 130 and one as a PDU 120). In general, the connectivity over the powered connection 125 may be based on transmitting data packets or frames 310, where such packets/frames 310 may be exchanged among the devices 200 using predefined power-line communication protocols, where a protocol consists of a set of rules defining how the devices interact with each other. In general, there are several existing technologies that are able to provide data communication over power-lines, such as those that support Ethernet over power (e.g., IEEE Std 1901-2010). In this particular example embodiment, Layer Discovery Protocol (LLDP—IEEE 802.1AB) frames may be used over the PLC links, where LLDP uses mandatory, optional, and organizationally specific Type-Length-Variable (TLV) fields to encode information to transmit. These TLVs can be utilized to send the identification information fields described previously.

Information contained in packets exchanged between the devices 200 may be stored in a Management Information Base (MIB) 235, which although shown in the functional circuitry 230 may alternatively (or additionally) be stored within the processing circuitry (ID module) 240. The information collected by the devices may then be accessible via a data network 140 to a server 300 (e.g., separate servers 300*a* and 300*b*, or else a same server), such as by using an application programming interface (API), simple network management protocol (SNMP), or web based system, so the information can be accessed by and/or collated in an external inventory database at the server(s) through associated data network packets/frames 320.

Figure 4A:
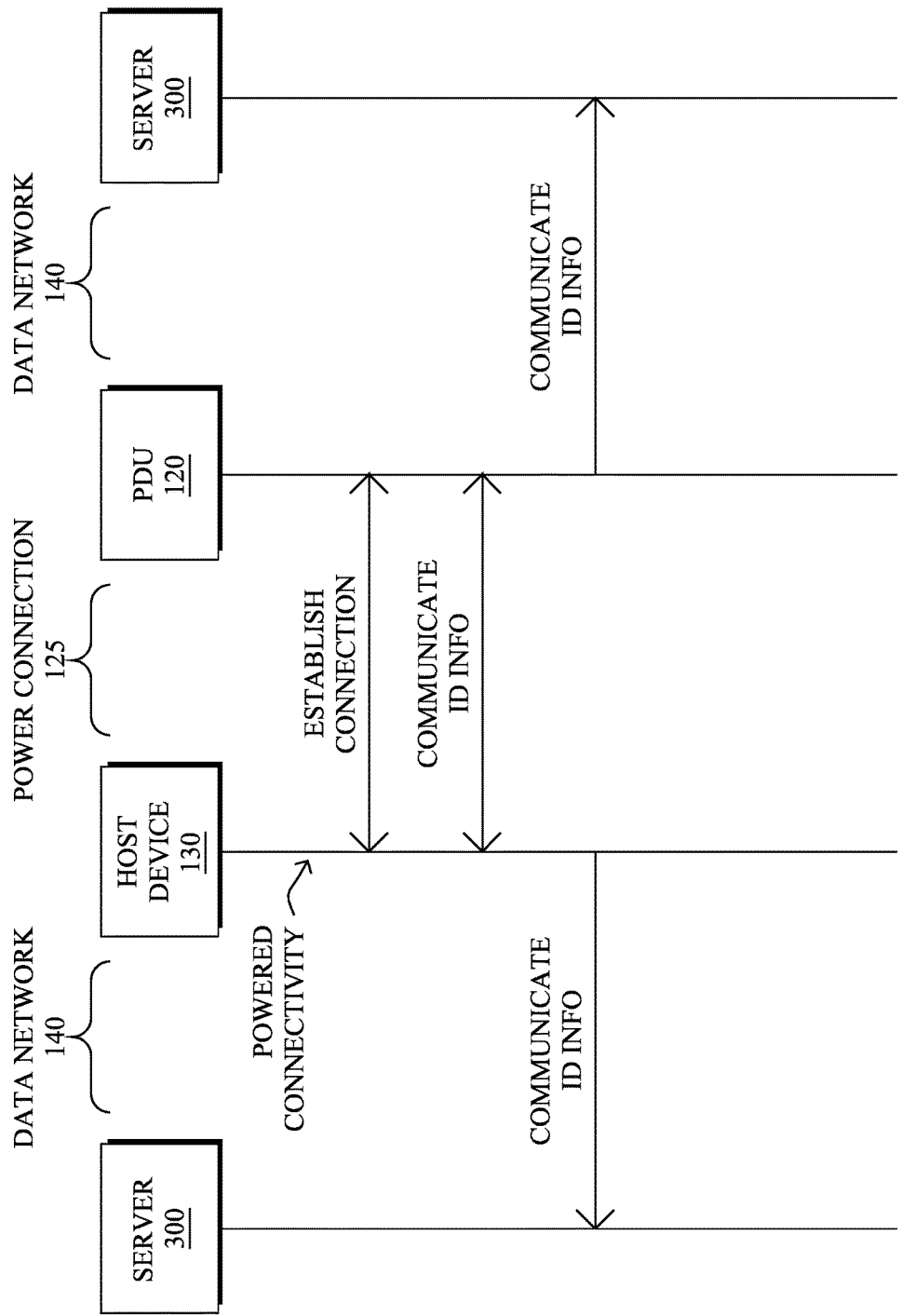
FIGS. 4A-4C illustrate example communications for data center management using device identification over power-line.
Figure 4B:
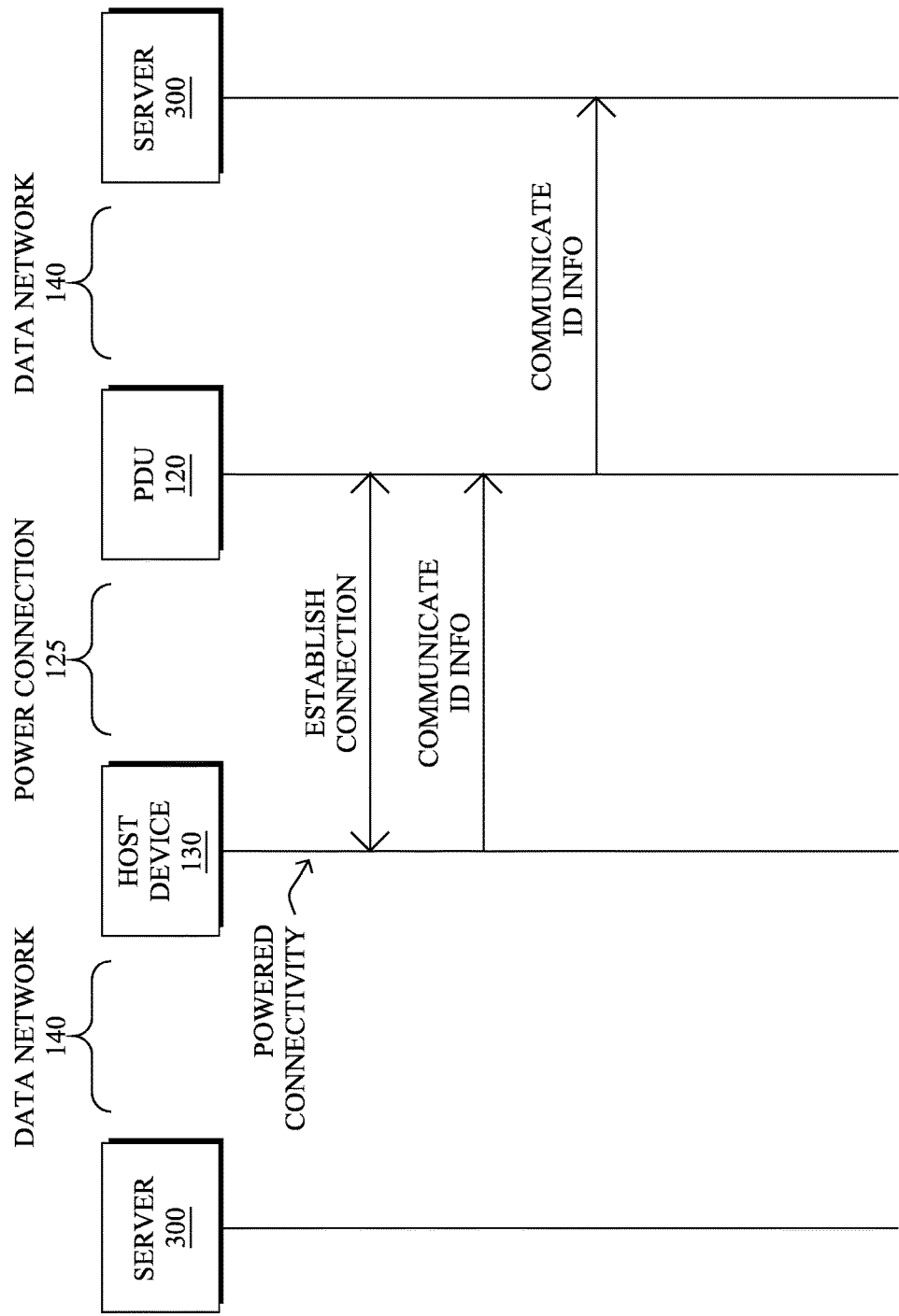
Figure 4C:
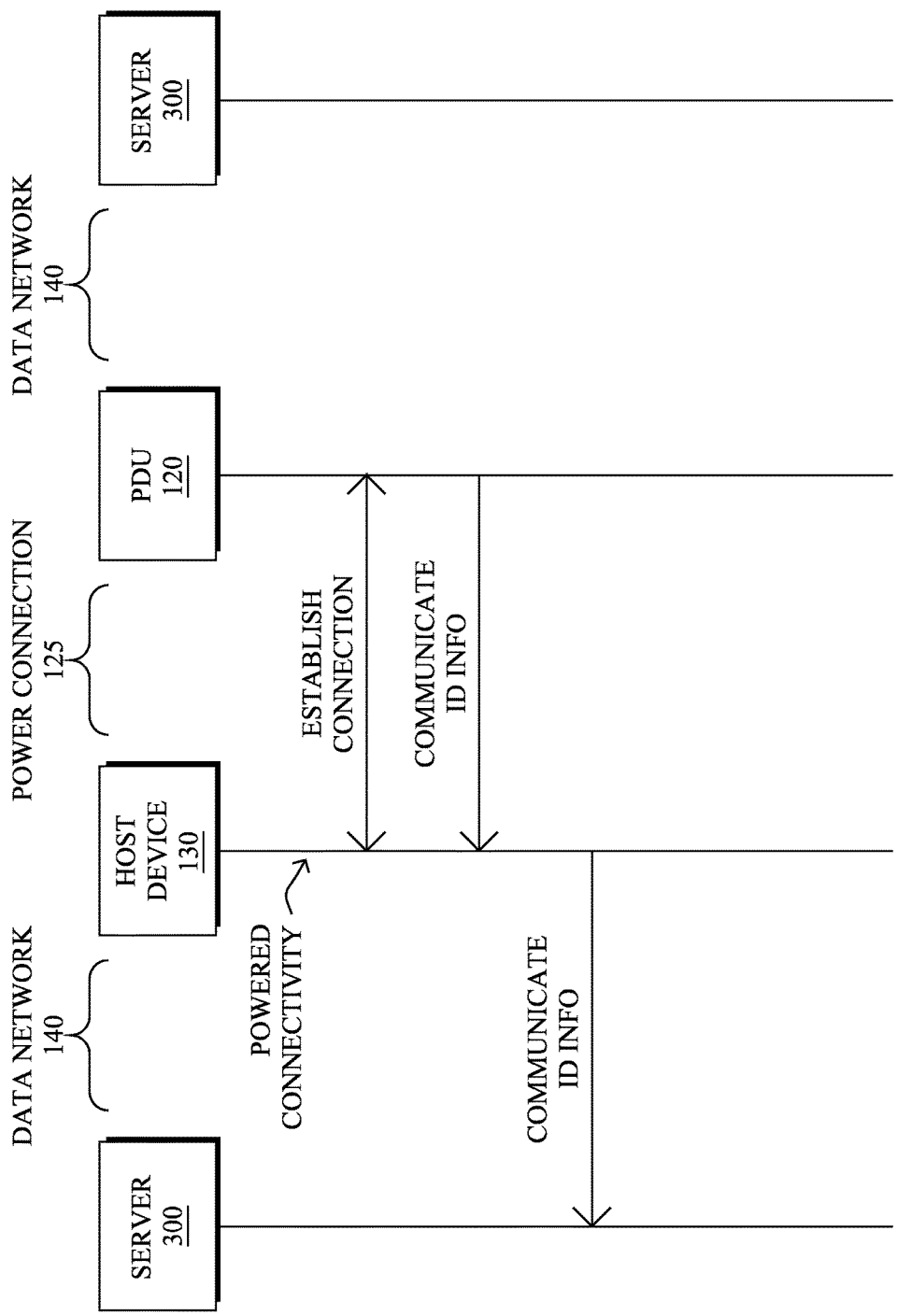

FIGS. 4A-4C illustrate example options for communications for data center management using device identification over power-line in accordance with one or more embodiments of the techniques herein. In particular, FIG. 4A illustrates an example where both the host device 130 and PDU 120 share the information. For instance, the communication layer and host component (processing circuitry 240 of host device 130) illustratively activates as soon as a power connection is made between the smart PDU 120 and the device 130. Once the power-line link layer connection has been established the, host device 130 and PDU 120 may both send/receive frames 310 to/from each other, exchanging the identifying information. (Note that as described below, the devices may have a timeout to expire entries when it receives no broadcast packets for a configurable period.) Once the information is exchanged over the powered connection 125, each device (host device 130 and PDU 120) may then relay that information over the data network 140 to a respective (or shared) server 300.

Conversely, as shown in FIG. 4B, an alternative embodiment requires only the PDU 120 to communicate the information over the data network 140 to a server 300. That is, the host device 130 may communicate its identification information over the power-line to the PDU 120, at which time the PDU may send this information, along with its own information, to an associated server 300. As still another alternative embodiment, FIG. 4C illustrates a situation where only the host device 130 communicates the information over the data network 140 to a server 300. Here, the PDU 120 may communicate its identification information over the power-line to the host device 130, at which time the host device may send this information, along with its own information, to an associated server 300.

Figure 5A:
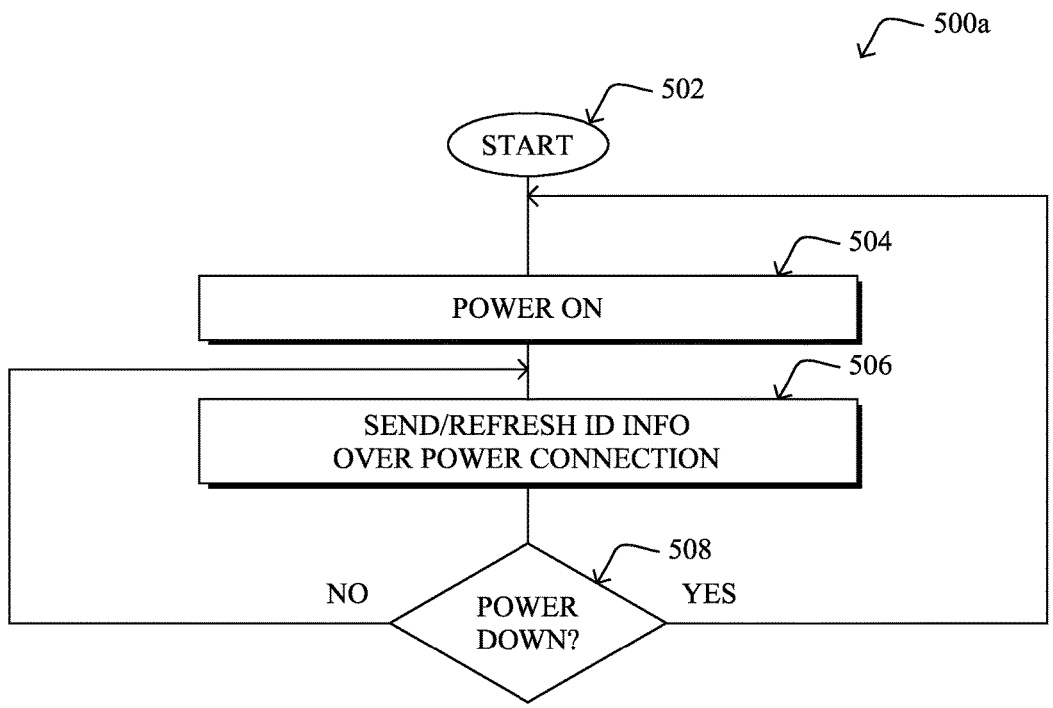
FIG. 5A illustrates an example simplified procedure for data center management using device identification over power-line, particularly from the perspective of a host device communicating its identification information.

FIG. 5A illustrates an example simplified procedure 500*a* for data center management using device identification over power-line in accordance with one or more embodiments described herein, particularly from the perspective of a host device 130 communicating its identification information (illustratively representing the situation in FIG. 4B above, but also portions of FIGS. 4A and 4C, accordingly). The procedure 500*a* may start at step 502, notably storing its identification information locally, and continues to step 504, where, as described in greater detail above, the host device 130 determines, over a power connection, that the device is in powered connectivity with the PDU 120 (i.e., is powered on). If so, then in step 506, the host device 130 may send its identification information (ID info) over the power connection to the PDU 120. Said differently, the host device 130 communicates with the PDU 120 over the power connection (in response to the powered connectivity), and exchanges its identification information with the PDU, such that the communicated identification information is accessible to another device (e.g., service 300) via a data network 140 due to the communicating over the power connection, as described herein. So long as the power is not down in step 508, then the communicated information may be refreshed in step 506, and procedure 500*a* continues accordingly.

Figure 5B:
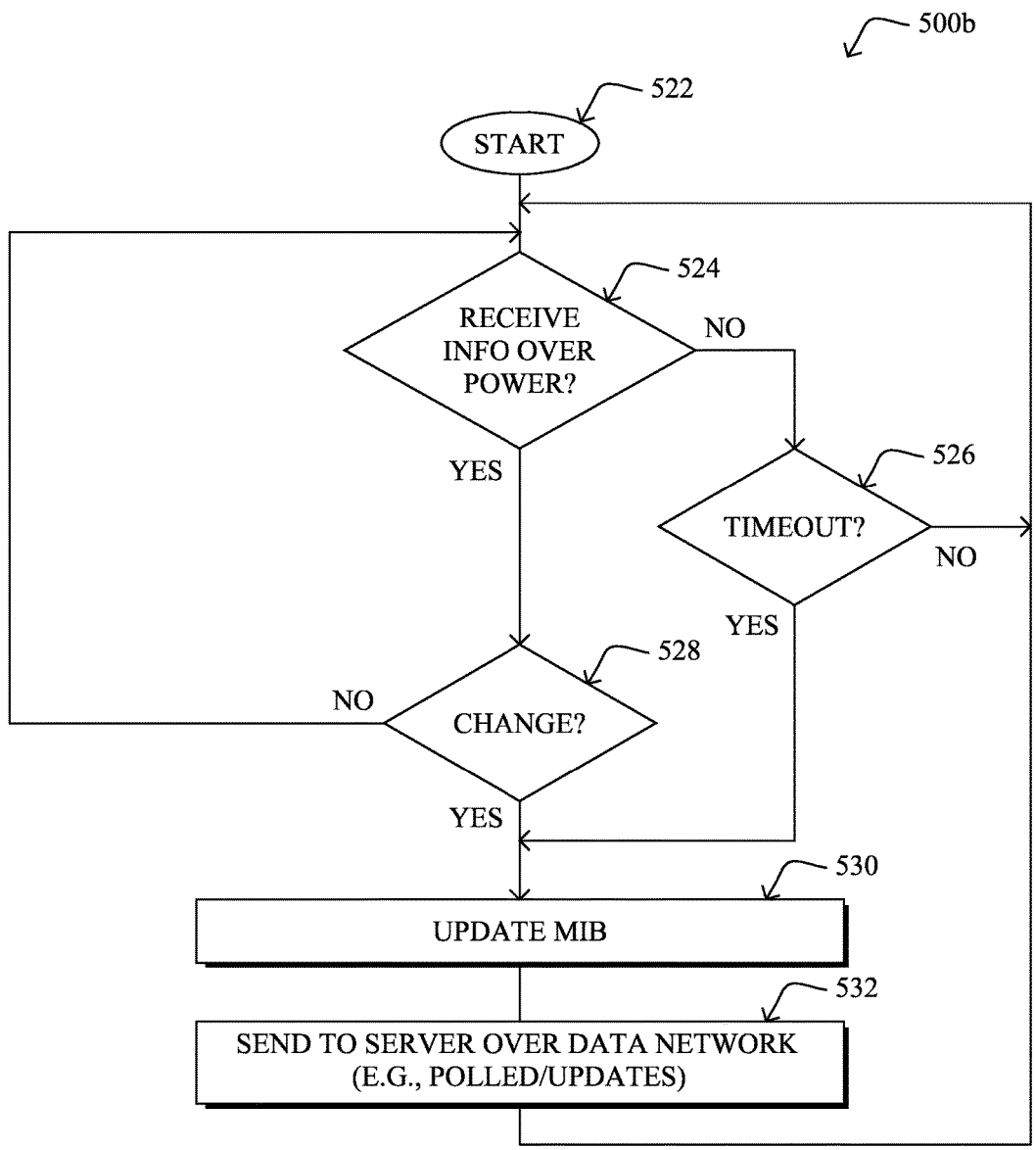
FIG. 5B illustrates an example simplified procedure for data center management using device identification over power-line, particularly from the perspective of either a host device or PDU communicating received identification information.

FIG. 5B, on the other hand, illustrates an example simplified procedure 500*b* for data center management using device identification over power-line in accordance with one or more embodiments described herein, particularly from the perspective of either a host device 130 or PDU 120 communicating received identification information (illustratively representing any of the situations in FIGS. 4A-4C above). The procedure 500*b* may start at step 522, and continues to step 524, where, as described in greater detail above, the device 200 (host device 130 or PDU 120) determines, over a power connection, when the device is in powered connectivity with the other device, and is receiving information over that powered connection. For instance, as described above in FIG. 5A, the host device may determine powered connectivity based on being powered on. However, the PDU 120 may determine powered connectivity based on receiving a communication at the PDU from the host device over the power connection. (Other techniques for detecting connectivity may also be used, and those mentioned herein are not meant to be limiting.) The information in step 524 may generally consist of identification information of at least one of either the host device 130 or PDU 120.

Assuming there is no timeout event in step 526, and in response to an actual change to the information in step 528 (for example, the first learned instance, or else other changes, such as dynamic information, e.g., current power utilization), the local MIB 235 may be updated in step 530, accordingly. Note that in response to a timeout in step 526, the MIB may also be updated (e.g., noting the timeout or removing the entry) in step 530. This learned information (i.e., the identification information of the connected device and of the local device) may then be sent to another device (e.g., server) over the data network 140 in step 532. For instance, as described above, step 532 may be in response to specific polling from the server 300, or else may be uploaded/updated as new information becomes available, or else periodically to avoid a timeout at the servers. (Note that as described below, the PDU 120 may also communicate power management messages regarding the host device with a power management system/server 300 over the data network, and communicates/relays those messages with the host device over the powered connection.)

According to the techniques herein, therefore, since the PDU 120 is associated with a physical location, and the communicated identification information accessible via the data network (e.g., to server 300) includes the associated physical location, the host devices 130 may be located/inventoried by a server 300 or other management device or accessing process/application.

Figure 5C:
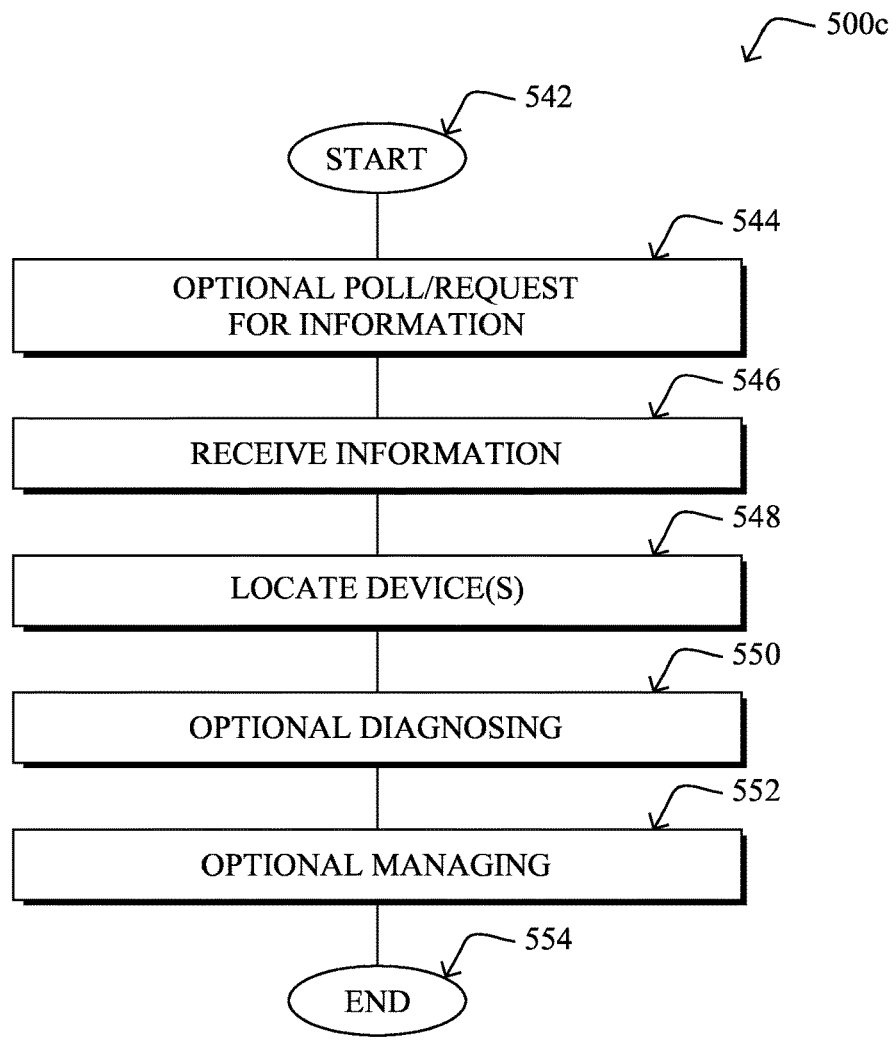
FIG. 5C illustrates an example simplified procedure for data center management using device identification over power-line, particularly from the perspective of a management device (e.g., server)

FIG. 5C illustrates an example simplified procedure 500c for data center management using device identification over power-line in accordance with one or more embodiments described herein, particularly from the perspective of a management device (e.g., server 300). The procedure 500c may start at step 542, and continues to step 544, where, optionally, the management device may poll or otherwise request the information described above, and may receive the information (as requested or else as received without a specific request) in step 546. Said differently, a server 300 may receive, over a data network, identification information of a host device 130 and a PDU 120, where the host device and PDU initially communicated the identification information over a power connection 125 that provides powered connectivity from the PDU to the host device, as described in detail above. In particular, as described above, since the PDU 120 is associated with a physical location, in step 548 the management device may locate the devices by determining, based on the identification information, a physical location of the PDU, and then deducing, based on the physical location of the PDU, that the host device 130 is physically located at the physical location of the power distribution unit. Having this information available grants the management device various benefits, such as inventory, confirmation (e.g., the ability to rapidly identify serial numbers of devices to link against support contracts), and other diagnosis/management functionalities.

For instance, optionally, in step 550, various levels of diagnosing may take place at the management device (e.g., server 300), such as determining, based on the identification information, a dual-power-supply issue with the host device 130. For instance, the dual-power-supply issue may be based on whether the host device is in proper powered connectivity with two different PDUs, such as only having one PDU supplying power to both power supplies of the host device, only having power to one PDU where another power supply has no power, etc. There is also the possibility for the management device to collect and report on power oversubscription based on current power utilization.

Notably, dual-power-supply issues may also be power-grid based, where the redundant PDUs are not merely supplying two options for receptacles, but where each of the redundant PDUs is on a different power source/grid. In this manner, determining a dual-power issue may result in detecting which servers are connected with a single power source versus also properly having a backup power source, such as by comparing the associated PDUs to knowledge of which grid source each PDU is connected to. If the two PDUs are improperly sourced by the same power grid, a notification may be generated to indicate that the associated device is only backed by single power source instead of two distinct power sources (e.g., in the case where a default policy requires or recommends two sources).

Further, and as described in greater detail below, in step 552 the management device may optionally perform power management functions, such as communicating power management messages regarding the host device with the PDU over the data network, where the PDU communicates the messages with the host device over the powered connection (or else simply acts on the power management message, such as turning off power to the host device).

Note also that power management functions may comprise planned outages, where action may entail notifying device administrators ahead of time, and optionally raising an alert if a device is backed by a single power source that is going to go down.

In still another embodiment, a physical host device may be hosting multiple virtual machines (VMs). Based on the power state (single/dual), and optionally also based on the service level agreement (SLA) for the VMs running on these host devices, power management may comprise moving the VMs to another host device in the data center, or perhaps notifying the VM owners about the planned outage. (Note that in the case of a cloud/hosted environment, the VM owner is typically unaware of the physical server—in that case, the system may simply automatically move that VM to meet the SLA (uptime/availability/etc.).) This particular embodiment may be used to support programmable data centers—with auto-migration policies that include the power source as an additional variable, e.g., in addition to the load on the server, traffic patterns, and other factors.

As such, the power management functions of step 552 may generally comprise determining that there is a planned power outage within a data center (e.g., in which a given host device and PDU reside), and determining, based on the identification information (e.g., power supply/grid, VM allocation, policies, SLAs, etc.), whether any advanced power-based action is to be performed within the data center in response to the planned power outage (e.g., notifications, migrations, etc.). As such, the power management function would then also comprise performing the advanced power-based action by the server, accordingly.

The simplified example procedure 500c may then end in step 554, though notably the procedure 500c may continue to operate to receive updated information, perform further polls/queries, administer various power management functions or diagnoses, and so on.

Figure 6A:
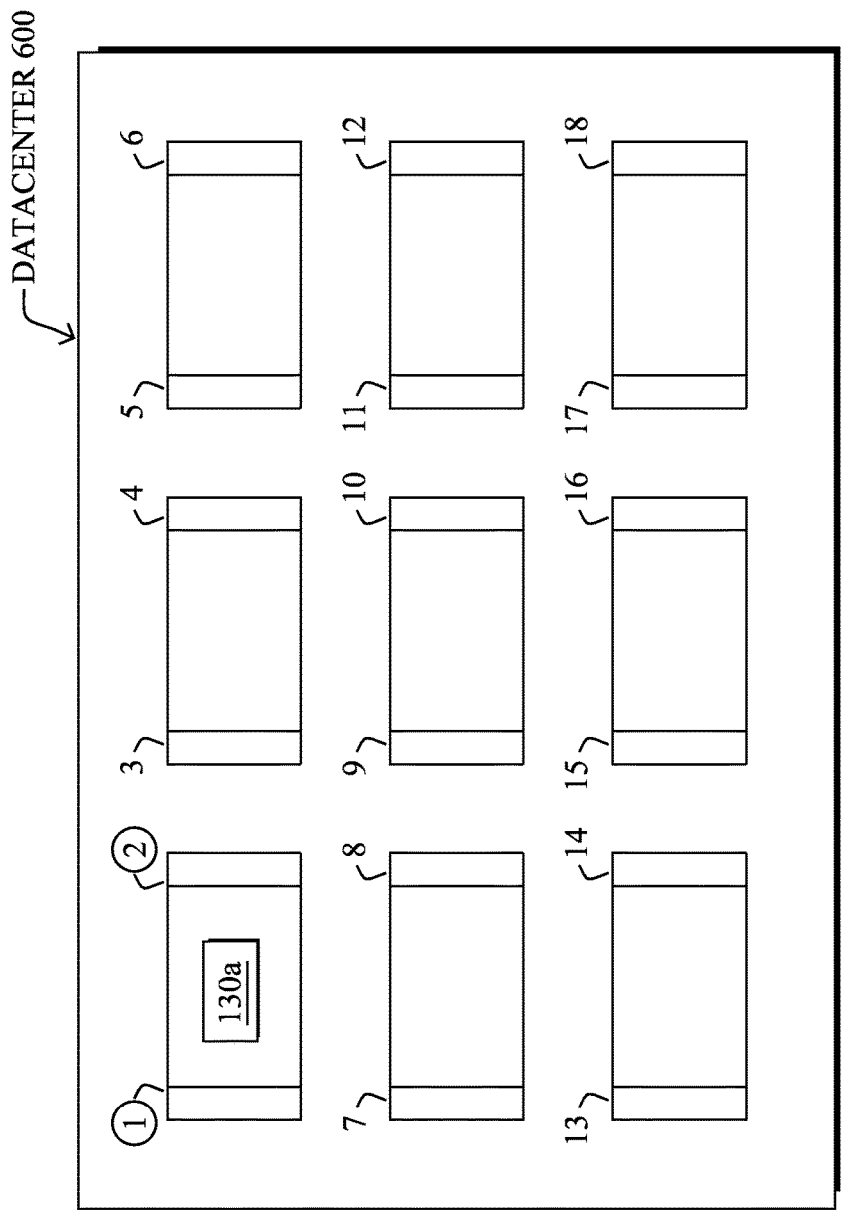
FIGS. 6A-6D illustrate examples of data center management using device identification over power-line.

By building the host identification component (ID module 240) into a host device 130, host identification can now be tied to a given chassis, no matter where it is placed in a data center, providing the ability to easily and automatically establish a host-to-location linkage. FIGS. 6A-6D illustrate examples of data center management using device identification over power-line in this manner, where FIG. 6A illustrates an example data center 600 with a plurality of racks 110 and associated dual PDUs 120 (120a and 120b). As shown, each of the PDUs 120 within the data center 600 is identified with a number from "1" to "18", and the assumption herein is that each of the physical locations of PDUs "1" to "18" is known/configured on the corresponding PDUs. As a particular host device 130a is plugged into both PDUs "1" and "2", it can be determined that the device 130a is located at the physical location (rack 110) of PDUs "1" and "2".

Figure 6B:
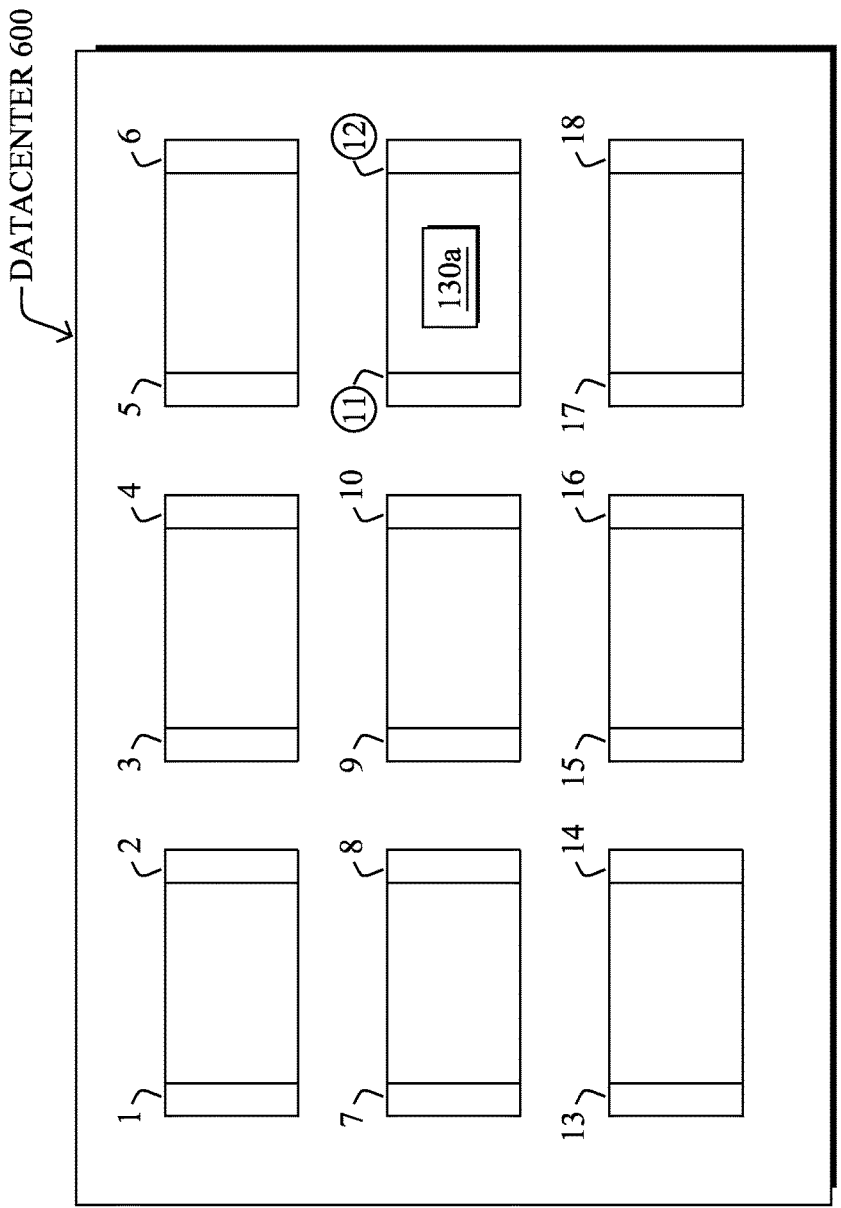

As shown in FIG. 6B, as the host device 130a is moved from one location to another and plugged in, such as to PDUs "11" and "12", the system is updated with the new physical location based on the new exchange between host device 130a and PDUs "11" and "12" being picked up by the external inventory database (server 300) on the next polling run across the data center and/or host devices as described above. As such, the only manual modification is the lifting and shifting of the hardware, and plugging it into the PDU at its new location, saving time and increasing the accuracy of inventories as this part of the process is carried out by the machine itself.

Since PDUs will generally be deployed in a known location, and PDUs will be configured as part of a data center deployment and left static during the operational phase of a data center, devices that are (as they should be) connected to PDUs in the rack they reside may be automatically tied to an associated physical location. The techniques herein, therefore, give data centers the ability to perform self inventories that are kept up-to-date as equipment moves within, in, out or between facilities. Note that this technology also has applications outside of data center facilities, such as anywhere that has hosts that can be spread across a large area, such as a campus, manufacturing or conference facilities. It also allows data center administrators to identify what PDU a piece of equipment is plugged into so that remote power off/on is easier, as described below.

Figure 6C:
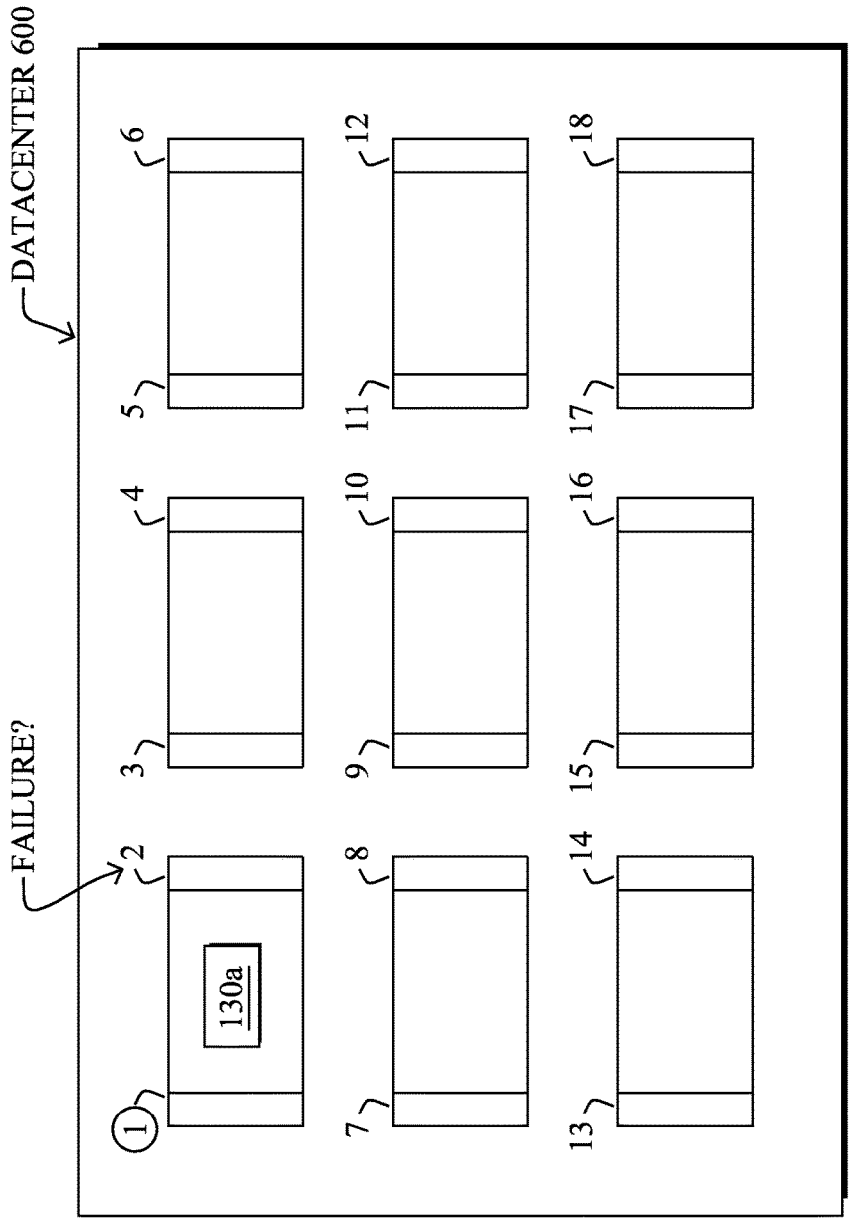
Figure 6D:
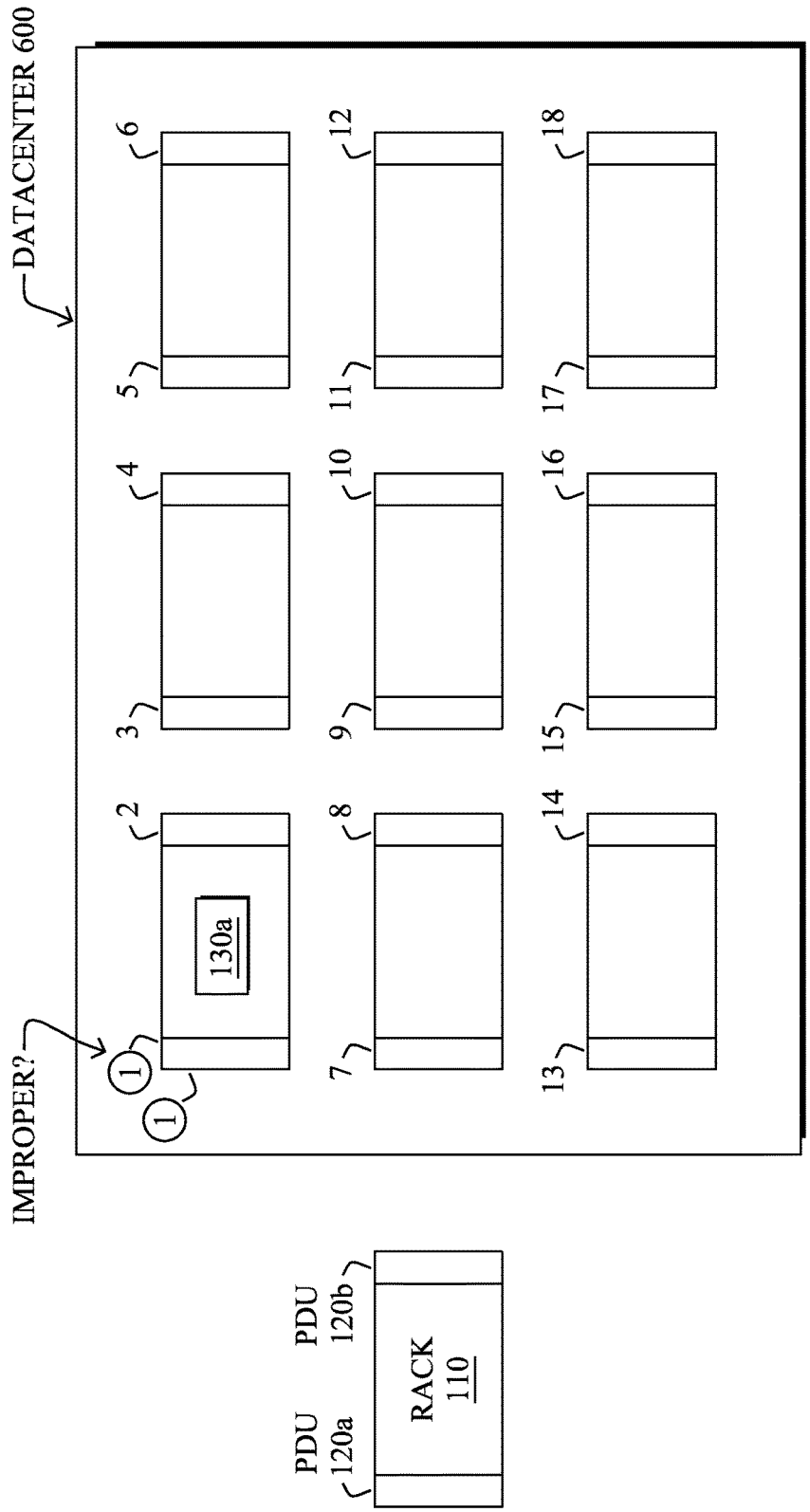

In addition to inventory management, the techniques herein also allow for various diagnosis mechanisms, such as by querying A-side and B-side smart PDUs in a rack to provide rapid highlighting of devices with single or failed power supplies during data center power maintenance. For example, as shown in FIG. 6C, it can be determined that host device 130a may be suffering from a power supply failure or a removed power cord if there is only one PDU ("2") receiving the power-connection-based identification information (e.g., and assuming it is known that device 130a should have two power supplies). Alternatively, as shown in FIG. 6D, it can be determined that both power supplies of the host device 130a are improperly plugged into the same PDU "1", which can cause administrator alarms or other remedial actions.

In accordance with one or more additional or alternative embodiments herein, the techniques may also be used in conjunction with off-band power management networks, which may generally be used to control PDUs over data networks, where the PDU receives power management commands to powercycle the attached devices. Supplying the location information herein, particularly the ability to dynamically track this information, is crucial for operation of such power management (e.g., assuming the specific power port/plug/receptacle is also identifiable). Additionally, however, the techniques herein may be used to extend the power management ability of this power management network. For example, in this particular extended embodiment, the PDU would provide access to the power management network over the data network 140, and the PDU itself can act as a switching device which carries frames (e.g., Ethernet frames) over the last hop to the device endpoints over the power-line connection.

Figure 7:
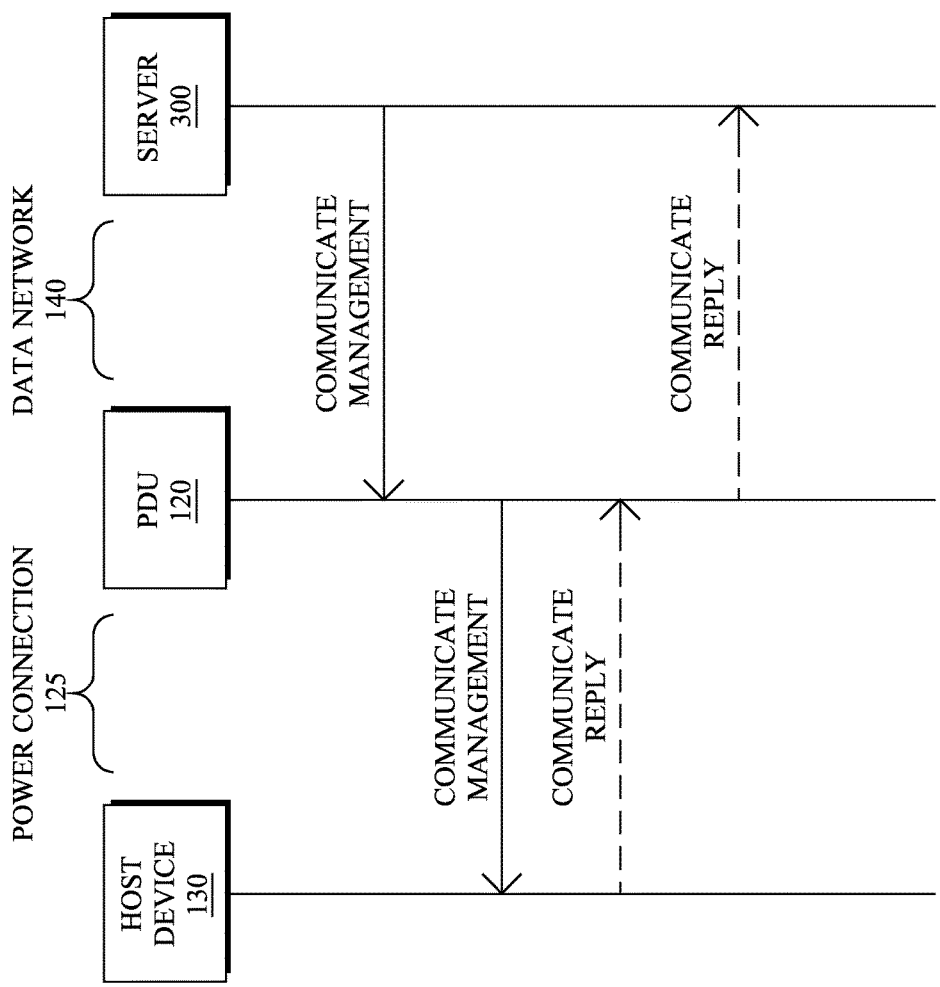
FIG. 7 illustrates an example communication for data center management using device identification over power-line.

FIG. 7 illustrates an example communication for data center management using device identification over power-line in accordance with this particular embodiment, where the server 300 communicates a management command/request over the data network 140 to the PDU 120. The PDU may then communicate the management over the powered communication link 125 to the corresponding host device 130. Note that optionally, the return communications (e.g., status, replies, etc.) may be relayed back to through the PDU over the same communication mediums (e.g., PLC-to-Ethernet), accordingly.

Figure 8A:
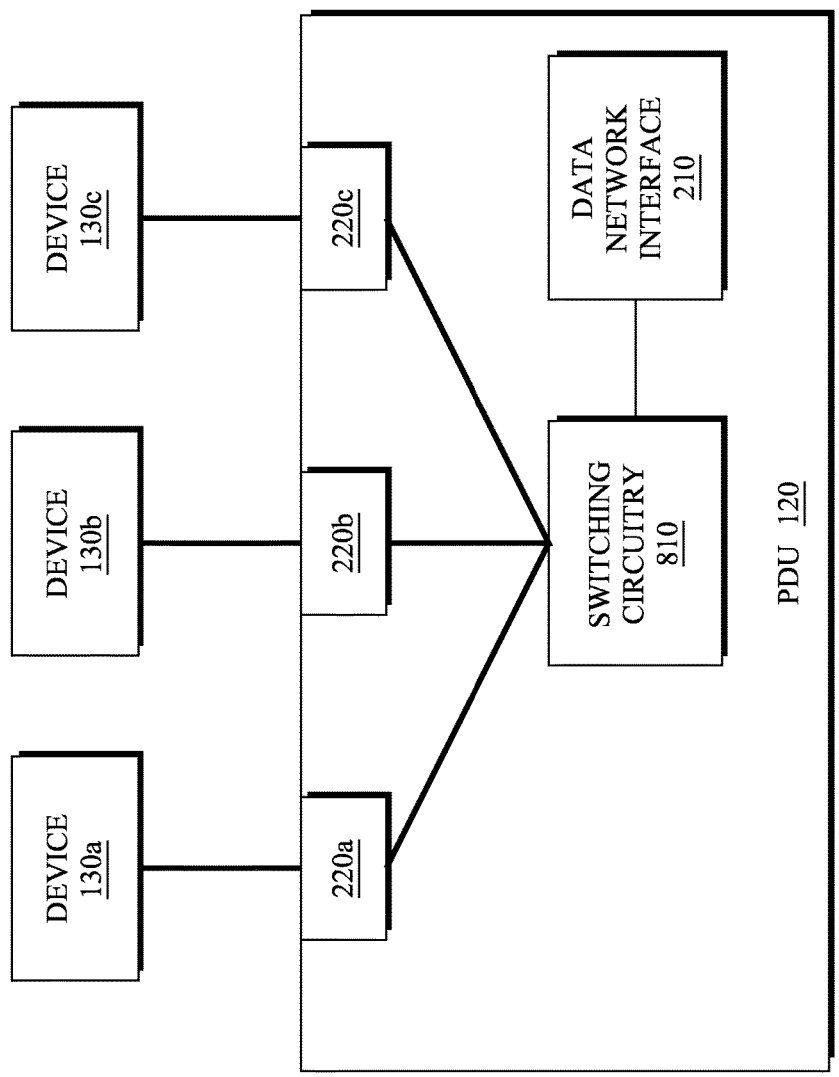
FIGS. 8A-8C illustrate examples of data center management over power-line.
Figure 8B:
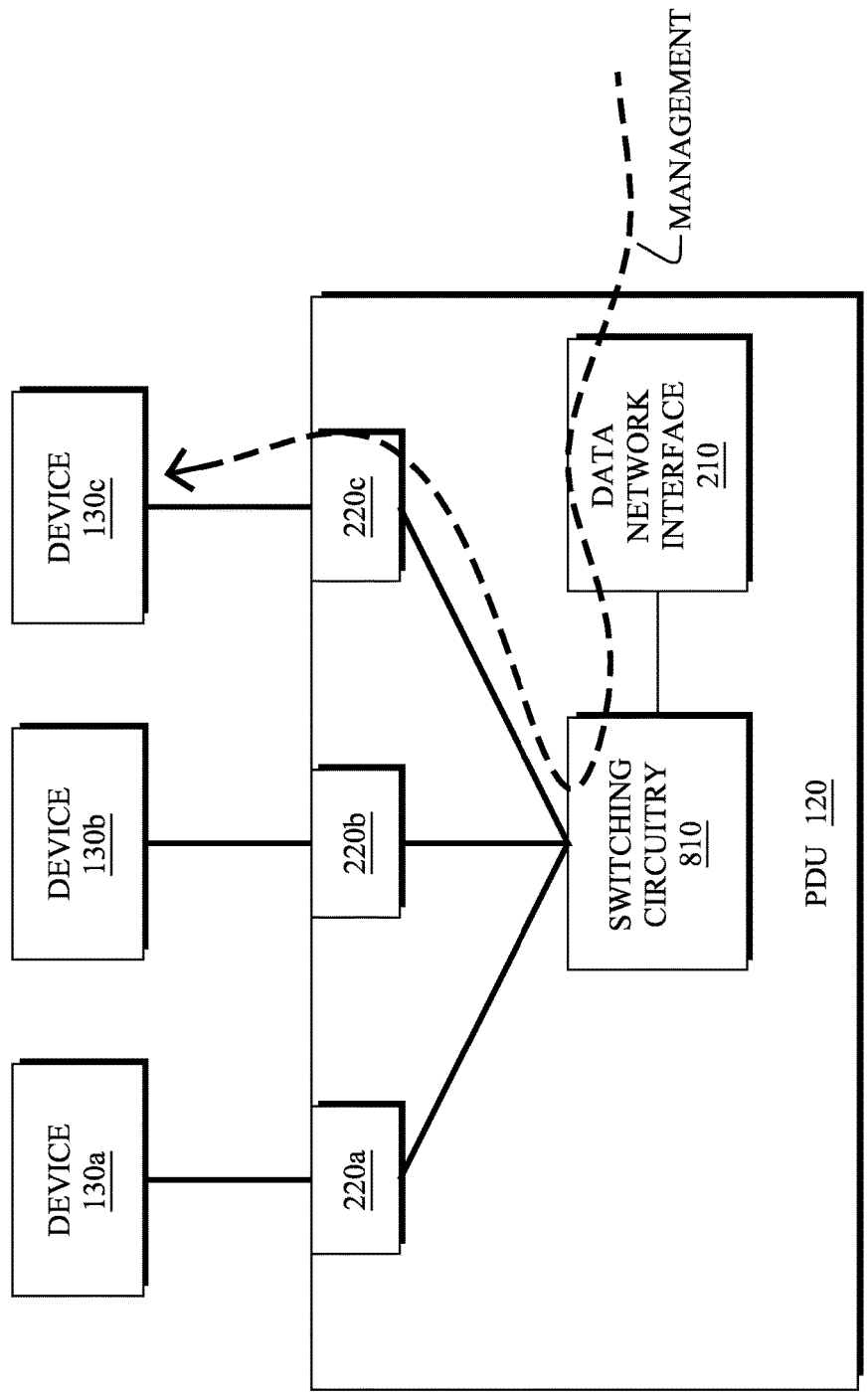
Figure 8C:
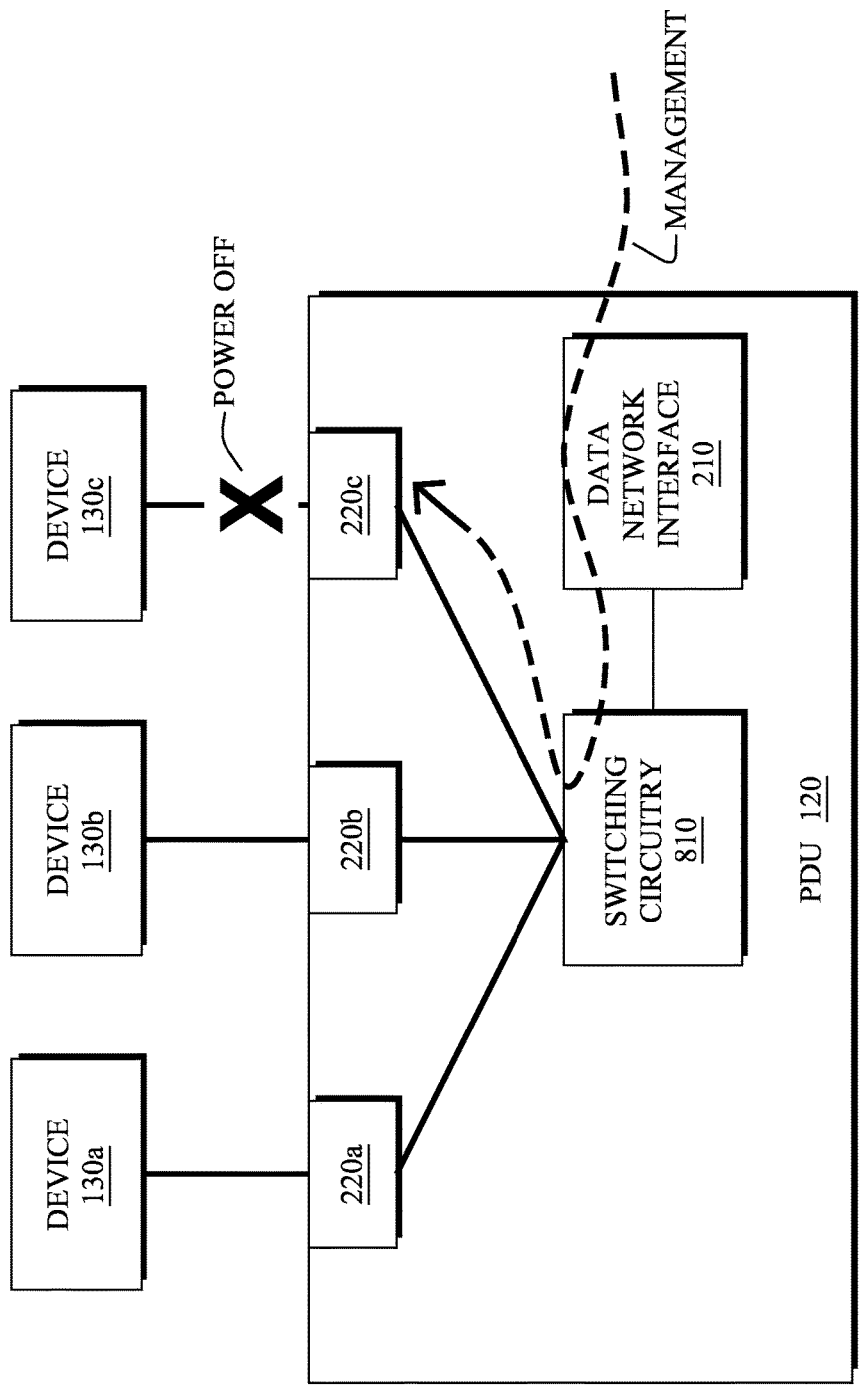

FIG. 8A illustrates an example schematic block diagram of a system in accordance with this embodiment for data center management over power-line, where the PDU 120 is shown with switching circuitry 810, which is configured to switch (or route or forward) communications from a power management data network 140 onto the powered connections 220a-c over power-lines to devices 130a-c, respectively. (Notably, this operation may require a protocol conversion between the data network and PLC connections at the switching circuitry 810.) Based on an addressing scheme, the power management servers 300 may be able to communicate with the power management components/circuitry of the host devices 130 through the PDUs 120. That is, by associating the identification of a host device 130 along with the specific location of a PDU 120, remote power management of the devices can be achieved through unifying the off-band access to the server right from the PDU/power management infrastructure—minimize cabling and clutter, broadening access, etc. For instance, as shown in FIG. 8B, management messages from the power management data network can be communicated (e.g., forwarded) to the appropriate host device (e.g., host device 130c), or else as shown in FIG. 8C, the PDU can simply act on the management command, such as shutting down the associated power connection 220c.

Figure 9:
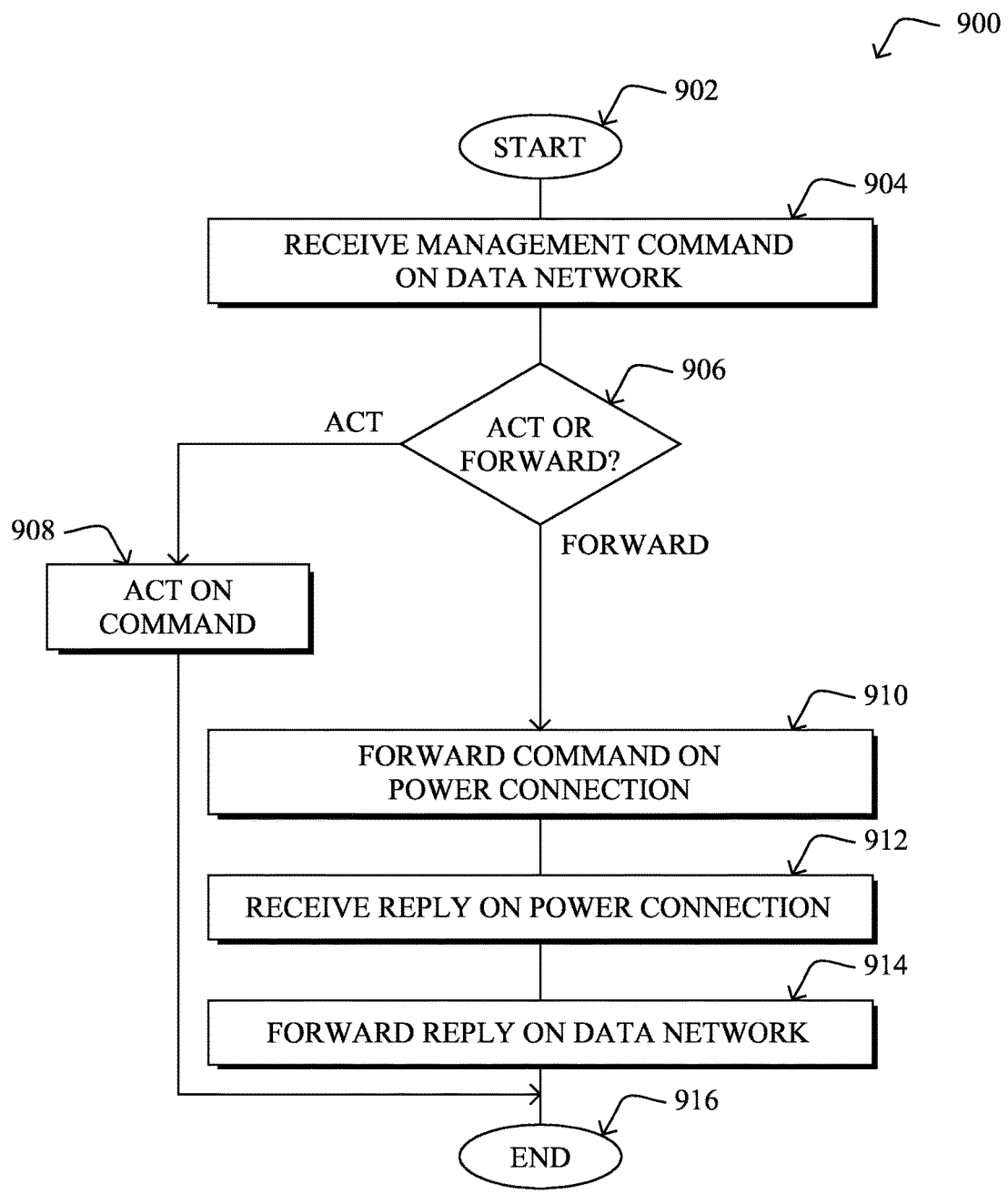
FIG. 9 illustrates an example simplified procedure for data center management using device identification over power-line, particularly from the perspective of a PDU communicating management commands.

FIG. 9 illustrates an example simplified procedure 900 for data center management using device identification over power-line in accordance with this extended embodiment, particularly from the perspective of a PDU 120 communicating management commands. The procedure 900 may start at step 902, and continues to step 904, where, as described in greater detail above, a management command is received on the data network 140 at the PDU 120 (i.e., communicating power management messages regarding the host device). If the command is for the PDU act in step 906, then the PDU acts accordingly in step 908, such as shutting down a power supply, returning power utilization reports, etc. Conversely, in step 910 the PDU may forward the command on the powered connection 125 (that is, communicates the power management messages with the host device over the powered connection), as mentioned above. Optionally, in step 912, the PDU may receive a reply on the power connection 125, and may forward that reply on the data network 140 back to the power management server 300, accordingly, in step 914 (i.e., communicating power management messages over the powered connection and data network, respectively). The illustrative and simplified procedure 900 may then end in step 916, notably with the option to continue communicating power management messages as necessary.

It should be noted that while certain steps within procedures 500a-c and 900 may be optional as described above, the steps shown in FIGS. 5A-5C and FIG. 9 are merely examples for illustration, and certain other steps may be included or excluded as desired. Further, while a particular order of the steps is shown, this ordering is merely illustrative, and any suitable arrangement of the steps may be utilized without departing from the scope of the embodiments herein. Moreover, while procedures 500a-c and 900 are described separately, certain steps from each procedure may be incorporated into each other procedure, and the procedures are not meant to be mutually exclusive.

The techniques described herein, therefore, provide for data center management using device identification over power-line. In particular, the techniques herein provide a mechanism for PDUs (power strips) in a data center rack to help identify what devices are in the associated rack, by communicating over the powered connection, and through communication of the device inventory upstream to a management solution. This marriage of systems enables a greater intersection of data points for analytics, and provides various benefits that come from having an accurate inventory of devices and their locations. For instance, with the techniques herein, a device only needs to be plugged in to power to be audited, allowing for rapid identification of location and quantity of hardware within a data center, and to quickly determine the power state of such devices (e.g., an improper configuration, power supply failure, power oversubscription, etc.).

While there have been shown and described illustrative embodiments that provide for data center management using device identification over power-line, it is to be understood that various other adaptations and modifications may be made within the spirit and scope of the embodiments herein. For example, the embodiments have been shown and described herein with relation to data centers and associated networks and/or connectivity. However, the embodiments in their broader sense are not as limited, and may, in fact, be used with other types of devices, network configurations, and so on (and particularly need not be associated with data centers). In addition, while certain protocols are shown, such as power-line communication protocols and/or discovery protocols, other suitable protocols may be used, accordingly.

The foregoing description has been directed to specific embodiments. It will be apparent, however, that other variations and modifications may be made to the described embodiments, with the attainment of some or all of their advantages. For instance, it is expressly contemplated that certain components and/or elements described herein can be implemented as software being stored on a tangible (non-transitory) computer-readable medium (e.g., disks/CDs/RAM/EEPROM/etc.) having program instructions executing on a computer, hardware, firmware, or a combination thereof. Accordingly this description is to be taken only by way of example and not to otherwise limit the scope of the embodiments herein. Therefore, it is the object of the appended claims to cover all such variations and modifications as come within the true spirit and scope of the embodiments herein.

What is claimed is:

1. A method, comprising:
    storing, on a host device, identification information of the host device;
    determining, over a power connection, when the host device is in powered connectivity with a power distribution unit;
    powering on the host device based on the powered connectivity with the power distribution unit;
    communicating, with the power distribution unit over the power connection in response to the powered connectivity, identification information of at least one of either the host device or the power distribution unit;
    receiving identification information of the power distribution unit at the host device; and
    sending the identification information of the host device and the identification information of the power distribution unit to a third device over a data network,
    wherein the communicated identification information is accessible to the third device via the data network due to the communicating over the power connection.

2. The method as in claim 1, wherein one of either the host device or power distribution unit is a power distribution unit associated with a physical location, and wherein the communicated identification information accessible to the third device via the data network includes the associated physical location.

3. The method as in claim 1, wherein communicating comprises:
    sending the identification information of the host device to the power distribution unit, wherein the power distribution unit is configured to send the identification information of the host device and identification information of the power distribution unit to the third device over the data network.

4. The method as in claim 1, further comprising:
    sending a communication to the power distribution unit from the host device over the power connection, wherein the power distribution unit determines that the host device is in powered connectivity with the power distribution unit based on receiving the communication.

5. The method as in claim 1, further comprising:
    refreshing the communicating, with the power distribution unit over the power connection, the identification information of at least one of either the host device or the power distribution unit.

6. The method of claim 1, wherein the third device is a server storing a data center inventory of host devices.

7. An apparatus, comprising:
    at least one network interface configured to communicate on a data network;
    at least one power connection configured to engage in power connectivity with a power distribution unit and to communicate with the power distribution unit;
    a processing circuit coupled to the network interface and power connection, and configured to execute a process, the process when executed configured to:
        store identification information of the apparatus, wherein the apparatus is a host device;
        determine, over the power connection, when the apparatus is in powered connectivity with the power distribution unit;
        communicate, with the power distribution unit over the power connection in response to the powered connectivity, identification information of at least one of either the apparatus or the power distribution unit;
        receive identification information of the power distribution unit at the apparatus;
        send the identification information of the apparatus and the identification information of the power distribution unit to a third device over the data network; and
        refresh the communicating, with the power distribution unit over the power connection, the identification information of at least one of either the host device or the power distribution unit,
        wherein the communicated identification information is accessible to the third device via the data network due to the communicating over the power connection.

8. The apparatus as in claim 7, wherein the power distribution unit is associated with a physical location, and wherein the communicated identification information accessible to the third device via the data network includes the associated physical location.

9. The apparatus as in claim 7, wherein the process when executed to communicate is further configured to:
  send the identification information of the apparatus to the power distribution unit, wherein the power distribution unit is configured to send the identification information of the apparatus and identification information of the power distribution unit to the third device over the data network.

10. The apparatus as in claim 7, wherein the third device is a server storing a data center inventory of host devices.

11. An apparatus, comprising:
  at least one network interface configured to communicate on a data network;
  at least one power connection configured to engage in power connectivity with a power distribution unit and to communicate with the power distribution unit;
  a processing circuit coupled to the network interface and power connection, and configured to execute a process, the process when executed configured to:
    store identification information of the apparatus, wherein the apparatus is a host device;
    determine, over the power connection, when the apparatus is in powered connectivity with the power distribution unit;
    power on the host device based on the powered connectivity with the power distribution unit;
    communicate, with the power distribution unit over the power connection in response to the powered connectivity, identification information of at least one of either the apparatus or the power distribution unit;
    receive identification information of the power distribution unit at the apparatus; and
    send the identification information of the apparatus and the identification information of the power distribution unit to a third device over the data network,
    wherein the communicated identification information is accessible to the third device via the data network due to the communicating over the power connection.

12. The apparatus as in claim 11, wherein one of either the host device or power distribution unit is a power distribution unit associated with a physical location, and wherein the communicated identification information accessible to the third device via the data network includes the associated physical location.

13. The apparatus as in claim 11, wherein the process when executed to communicate is further configured to:
  send the identification information of the apparatus to the power distribution unit, wherein the power distribution unit is configured to send the identification information of the apparatus and identification information of the power distribution unit to the third device over the data network.

14. The apparatus as in claim 11, wherein the third device is a server storing a data center inventory of host devices.

* * * * *